US008853784B2

(12) United States Patent
Lai et al.

(10) Patent No.: US 8,853,784 B2
(45) Date of Patent: *Oct. 7, 2014

(54) ESD PROTECTION CIRCUIT

(71) Applicant: GLOBALFOUNDRIES Singapore Pte. Ltd., Singapore (SG)

(72) Inventors: Da-Wei Lai, Singapore (SG); Handoko Linewih, Singapore (SG); Ying-Chang Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/737,964

(22) Filed: Jan. 10, 2013

(65) Prior Publication Data

US 2013/0187231 A1    Jul. 25, 2013

Related U.S. Application Data

(63) Continuation-in-part of application No. 13/669,409, filed on Nov. 5, 2012.

(60) Provisional application No. 61/588,186, filed on Jan. 19, 2012.

(51) Int. Cl.
*H01L 23/62* (2006.01)
*H01L 29/66* (2006.01)
*H01L 29/78* (2006.01)

(52) U.S. Cl.
CPC ..................................... *H01L 29/78* (2013.01)
USPC ................... 257/355; 257/328; 257/E29.256; 257/E29.257; 257/E21.418; 257/E29.015

(58) Field of Classification Search
CPC . H01L 29/78; H01L 29/7833; H01L 29/7835; H01L 29/73; H01L 29/0847; H01L 29/0692; H01L 29/1045; H01L 29/1087; H01L 29/41758; H01L 29/4238; H01L 29/4933; H01L 29/665; H01L 27/0266; H01L 27/0251; H01L 27/0277; H01L 27/02
See application file for complete search history.

(56) References Cited

U.S. PATENT DOCUMENTS

| 5,686,751 | A  | * | 11/1997 | Wu .................................. 257/356 |
| 5,760,446 | A  | * | 6/1998  | Yang et al. ..................... 257/357 |
| 6,569,740 | B1 | * | 5/2003  | Smith ............................. 438/279 |
| 2005/0285200 | A1 | * | 12/2005 | Kim ................................. 257/360 |
| 2010/0019318 | A1 | * | 1/2010  | Chao et al. ..................... 257/336 |
| 2012/0193711 | A1 | * | 8/2012  | Asano et al. ................... 257/343 |

* cited by examiner

*Primary Examiner* — Julio J Maldonado
*Assistant Examiner* — Moazzam Hossain
(74) *Attorney, Agent, or Firm* — Horizon IP Pte. Ltd.

(57) ABSTRACT

A device having a substrate defined with a device region which includes an ESD protection circuit is disclosed. The ESD protection circuit has first and second transistors. A transistor includes a gate having first and second sides, a first diffusion region in the device region adjacent to the first side of the gate, and a second diffusion region in the device region displaced away from the second side of the gate. The first and second diffusion regions include dopants of a first polarity type. The device includes a first device well which encompasses the device region and second device wells which are disposed within the first device well. A well contact is coupled to the second device wells. The well contact surrounds the gates of the transistors and abuts the first diffusion regions of the transistors.

20 Claims, 5 Drawing Sheets

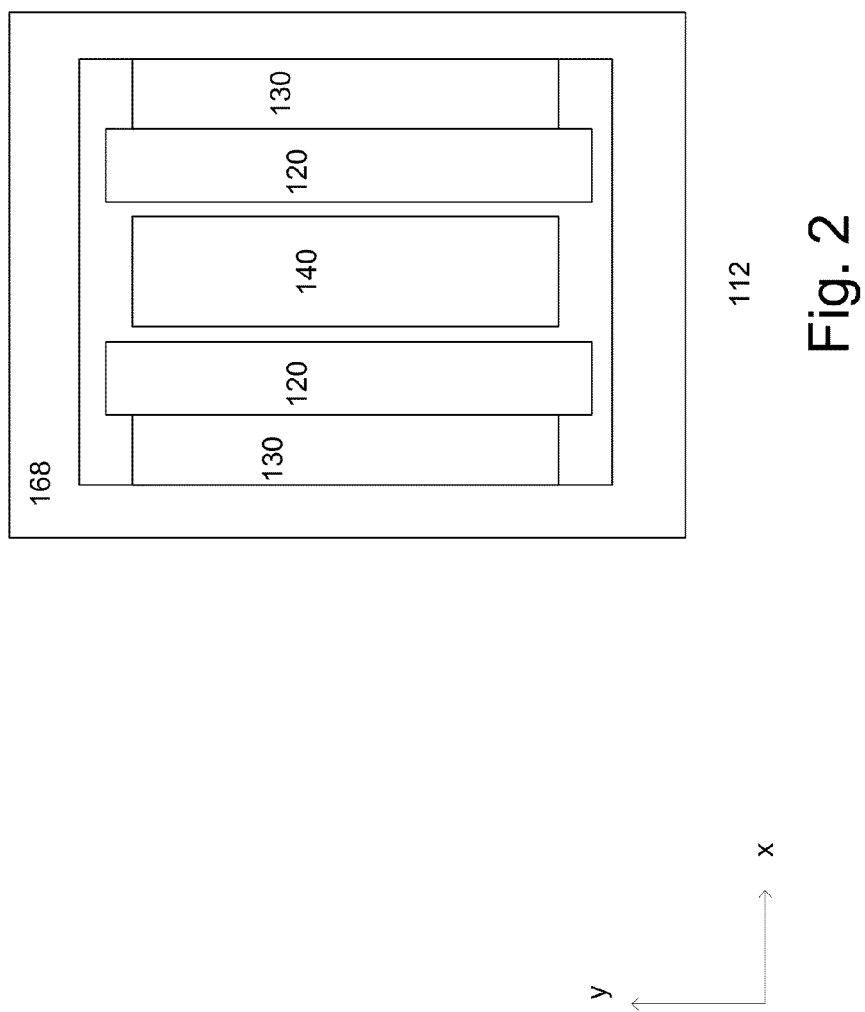

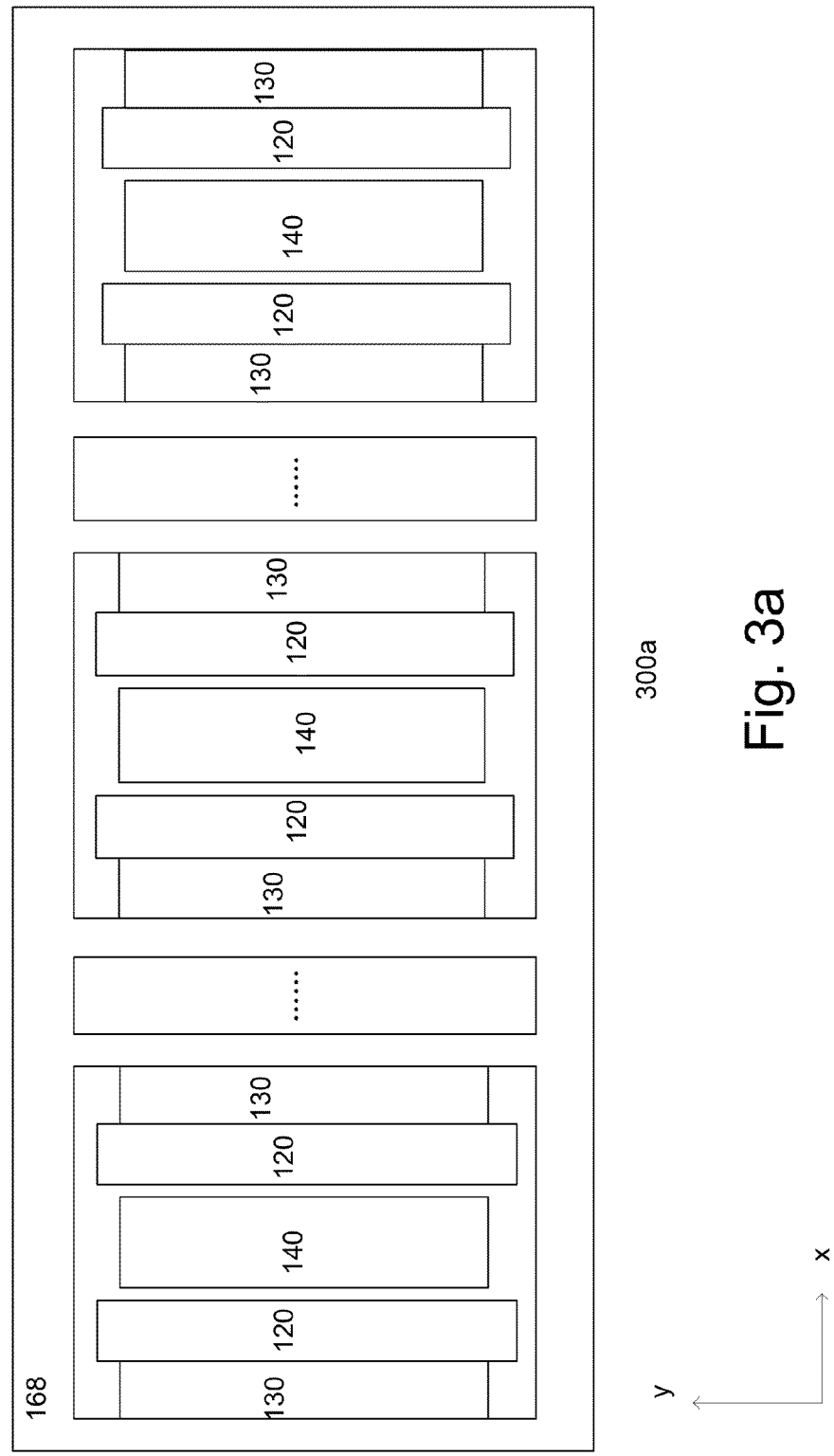

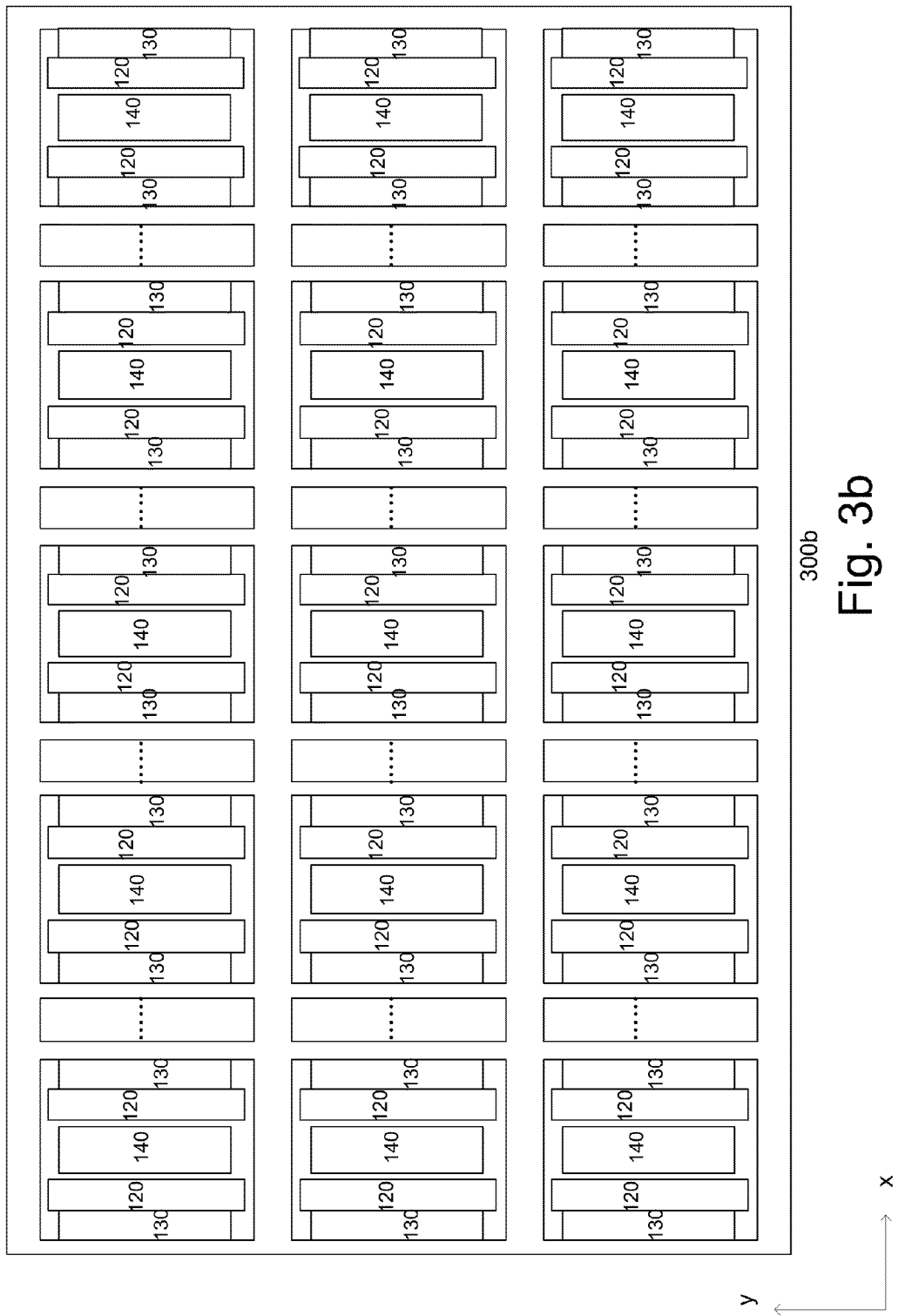

ESD PROTECTION CIRCUIT

BACKGROUND

Traditional n-type lateral diffused metal oxide semiconductor (nLDMOS) has some inherent poor characteristics, such as "strong snapback", which leads to latch up during normal IC operation. Latch up affects the operation of the IC, rendering it defective.

The disclosure is directed to a compact ESD protection device with improved ESD performance to avoid damaging internal circuits and at the same time having high latch up immunity.

SUMMARY

Embodiments generally relate to semiconductor devices. In one embodiment, a device having a substrate defined with a device region which includes an ESD protection circuit is disclosed. The ESD protection circuit has first and second transistors. A transistor includes a gate having first and second sides, a first diffusion region in the device region adjacent to the first side of the gate, and a second diffusion region in the device region displaced away from the second side of the gate. The first and second diffusion regions include dopants of a first polarity type. The device includes a first device well which encompasses the device region and second device wells which are disposed within the first device well. A well contact is coupled to the second device wells. The well contact surrounds the gates of the transistors and abuts the first diffusion regions of the transistors.

In another embodiment, a device having a substrate defined with a device region which includes an ESD protection circuit is disclosed. The ESD protection circuit has first and second transistors. A transistor includes a gate having first and second sides, a first diffusion region in the device region adjacent to the first side of the gate, and a second diffusion region in the device region displaced away from the second side of the gate. The first and second diffusion regions include dopants of a first polarity type. The device includes a first device well which encompasses the device region, second device wells which are disposed within the first device well, and a third well which is disposed under the second diffusion region and within the first device well. A well contact is coupled to the second device wells. The well contact surrounds the gates of the transistors and abuts the first diffusion regions of the transistors.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2 shows a simplified top view of a portion of the device of FIG. 1;

FIGS. 3a-b show an array of an embodiment of a device; and

DETAILED DESCRIPTION

Embodiments generally relate to semiconductor devices. ESD circuits are provided for the devices. For example, the ESD circuits may be used in high voltage applications or devices. ESD circuits, for example, are activated during an ESD event to dissipate ESD current. The devices, for example, may be any type of semiconductor devices, such as integrated circuits (ICs). Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1:
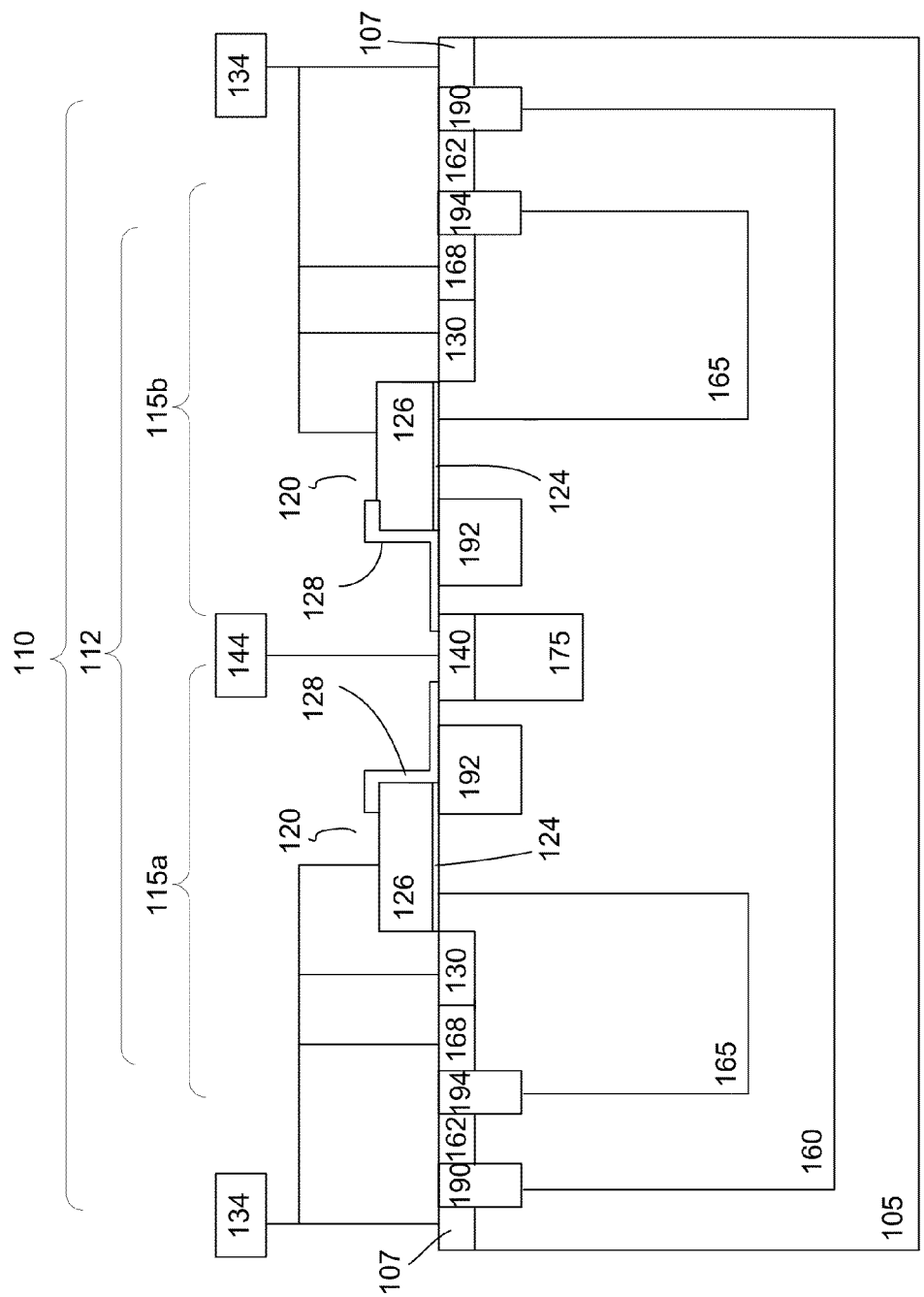
FIG. 1 shows a cross-sectional view of an embodiment of a device.

FIG. 1 shows a cross-sectional view of an embodiment of a device 100. As shown, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;
$x$=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\ cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

As shown, the device includes a device region 110 defined on the substrate. A device isolation region 190 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for a STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements.

The device region includes an ESD protection circuit 115. The ESD protection circuit, in one embodiment, includes a plurality of lateral diffused (LD) transistors coupled in parallel. For example, the ESD protection circuit includes n LD transistors. In one embodiment, the device region includes first and second (e.g., n=2) transistors 115a-b. The LD transistors, for example, are LD metal oxide semiconductor (LDMOS) transistors.

In one embodiment, a first doped well 160 is disposed in the substrate in the device region. The first doped well, as shown, encompasses the complete device region. For example, the first doped well serves as a first device well which is disposed in the substrate from about an inner edge of the device isolation region. Providing the first doped well which extends from the bottom of the isolation region between inner and outer edges of the isolation region is also useful. In one embodiment, the first well serves as an isolation well. For example, the first well isolates the ESD protection circuit from the substrate. The first well should be sufficiently deep to serve as an isolation well.

The first well includes first polarity type dopants. In one embodiment, the first well is lightly doped with first polarity type dopants. For example, the dopant concentration of the first well may be about $1E11/cm^3$-$5E13/cm^3$. Providing a first well having other dopant concentrations may also be useful. In one embodiment, the first polarity type is n-type. For example, the first well may be $n^-$ well for a n-type device. Providing p-type as the first polarity type is also useful. For example a $p^-$ well may be employed for a p-type device.

Each of the transistors includes a gate 120 which is disposed on the surface of the substrate in the device region. A gate may be referred to as a finger. The gate includes a gate electrode 126 disposed over a gate dielectric 124. The gate electrode may be polysilicon. Other materials may also be useful. As for the gate dielectric, it may be silicon oxide. Other gate dielectric materials may also be useful. In one embodiment, the gate is similar to gates used for core devices. Other configurations of gates may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 130 and 140. The S/D regions are first polarity type doped regions disposed in the substrate. The S/D regions are, for example, heavily doped first polarity type regions. For example, the S/D regions may have a depth of about 0.1-0.4 μm. Other depths may also be useful. The S/D regions may be similar to those of other transistors of the device. In one embodiment, the first S/D region 130 is a source region and the second S/D region 140 is a drain region of the transistor.

As shown, the first and second LD transistors 115a-b are configured to have a common second S/D or drain region 140. Other configurations of the LD transistors may also be useful. The first S/D region 130 is disposed adjacent to a first sidewall of the gate. As shown, a first side of the source region aligns with the first sidewall of the gate. The gate, for example, may also overlap a portion of the source region 130. Other configurations of the first S/D region 130 may also be useful. As for the second S/D region 140, it is displaced away from a second sidewall of the gate. The displacement may be, for example, referred to as the drift distance.

In one embodiment, a drift isolation region 192 is provided between the gate 120 and the second S/D region 140. The drift isolation region, for example, is a STI. Other types of drift isolation region may also be useful. As shown, the gate overlaps the drift isolation region. The drift isolation region can be employed to increase the effective drift distance. For example, the drift distance can be increased to be equal to the profile of the drift isolation region. The second S/D region, in one embodiment, is disposed away from the drift isolation region. In another embodiment, the second S/D region may abut the drift isolation region. The distance between the second S/D region and the drift isolation region, for example, may be varied to fine tune the ESD performance. Other configurations of the second S/D region may also be useful.

Sidewalls of the gate may be provided with dielectric spacers. As shown, the second sidewall of the gate is provided with a dielectric spacer 128. The dielectric spacers, for example, may be silicon oxide spacers. Other types of dielectric materials may also be useful, such as silicon nitride or a combination of dielectric materials or layers. For example, the spacers may be composite spacers. The spacer, for example, may be referred to as a silicide blocking layer and may be employed to increase the effective drift distance. The spacers may also facilitate forming the lightly doped and S/D regions. For example, the lightly doped region (not shown) is formed prior to spacer formation while the second S/D region 140 is formed after spacer formation. Other configurations of spacers may also be useful. For example, the spacer may be a single spacer. In some cases, the transistor may also include a halo region. The halo region (not shown) is a second polarity doped region abutting the lightly doped and S/D regions under the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on a channel of the transistor below the gate to improve performance.

Second doped wells 165 are disposed in the substrate. The second wells are disposed in the device region. For example, the second wells are disposed within the first well. The second wells serve as second device wells or body wells of the ESD device. The second wells include second polarity dopants for a first polarity type device. For example, the second wells include p-type dopants for an n-type device or n-type dopants for a p-type device. The dopant concentration may depend on the voltage requirement of the device. The second wells may be lightly ($x^-$) or intermediately (x) doped with second polarity type dopants. For example, the second wells may be p type well for a n-type device. Other dopant concentration for the second wells suitable for, for example, high voltage applications, may also be useful.

The substrate and the first and second wells, in one embodiment, are provided with substrate contact 107, first and second well contacts 162 and 168 respectively for biasing the substrate and wells. The substrate contact and well contacts are heavily doped regions, similar to the S/D regions. For example, a depth of the substrate contact or well contact is shallower than a depth of the device isolation region and the substrate contact and well contacts are in communication with the respective substrate and wells. The dopant concentration of the contacts may be about $5E15$ cm$^3$-$9E15$/cm$^3$. The substrate contact and well contacts have the same polarity type as the respective substrate and wells. For example, the first well contact 162 is a first polarity type doped region and the second well contact 168 is a second polarity type doped region. In one embodiment, the second well contact 168 abuts the first S/D region 130. The second well contact 168, for example, serves as a substrate tap.

The second well 165, in one embodiment, at least encompasses the second well contact 168, the first S/D region 130 and a part of the gate 120. As shown, the second well extends from the bottom of the isolation region 194 between inner and outer edges of the isolation region and encompasses the second well contact, the first S/D region and a portion of the gate. The second well, for example, does not encompass the second S/D region 140. Other configurations of the second well may also be useful. A depth of the second well is shallower than the first well.

We have discovered that the configuration of the second wells or separate second wells as described above forces the current to flow only in the vertical direction during, for example, ESD testing from the drain to the source region with positive zapping. This suppresses the strong snapback characteristics of the nLDMOS and results in improved and more uniform turn on of the ESD device.

In one embodiment, isolation regions 194 may be provided to separate the well contact regions. The isolation regions may be STI regions. For example, the isolation regions may be similar to the device isolation regions. Other types or configurations of isolation regions may also be useful.

Metal silicide contacts (not shown) may be formed on the gate electrode and various contact regions. For example, metal silicide contacts may be provided over the S/D regions, well contacts and gate electrode. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of the silicide contacts may also be useful. The silicide contacts may be employed to reduce contact resistance and facilitate contact to the back-end-of-line metal interconnects.

In one embodiment, the substrate, second well, the first S/D region and gate are commonly coupled to a first terminal 134 of the ESD device. The second S/D region is coupled to a second terminal 144 of the ESD device. For example, the first terminal is a source terminal and the second terminal is a drain terminal. The source terminal, for example, is coupled to ground while the drain terminal, for example, is coupled to $V_{DD}$ or I/O pad. Other configurations of terminal connections to the ESD devices may also be useful.

In one embodiment, a third well 175 is provided. The third well, for example, serves as a second S/D or drain well. The drain well is disposed in the substrate under the drain region. The width of the third well may be, for example, narrower than, the same as, or larger than the width of the drain, depending on the operation voltage. As shown, the width of the third well is the same as the width of the drain. The drain well, for example, may be optimized depending on the total drain area. The depth of the drain well is between the bottom of the drift isolation region and body well. Other depths for the drain well may also be useful.

The drain well 175 includes first polarity type dopants. In one embodiment, the dopant concentration of the drain well is lower than the second S/D region 140. In one embodiment, the drain well may be intermediately (x) doped with first polarity type dopants. Other dopant concentrations may also be useful.

We have discovered that, by providing a drain well under the drain, lower resistance path is created in the vertical direction. As such, current is directed to flow in the vertical direction instead of in the horizontal direction. This suppresses the strong snapback characteristics of the nLDMOS and results in higher trigger current under, for example, ESD testing from the second terminal 144 to the first terminal 134 with positive zapping.

Furthermore, in accordance with one embodiment, unlike conventional ESD device, no drift well is provided. For example, a drift well which is shallower than the second well and having first polarity type dopants which is generally encompasses the second S/D region and extends under the gate in a conventional ESD device is not provided. Without the drift well, the drain 140 is coupled to the channel by the isolation well 160. Eliminating the drift well eliminates base push-out phenomenon. The current is directed to flow only in the vertical direction. This suppresses the strong snapback characteristics of the nLDMOS and results in improved and more uniform turn on of the ESD device. We have also discovered that this configuration improves ESD performance.

FIG. 2 shows a simplified top view of a portion 112 of the device as described with respect to FIG. 1. The portion, as shown, extends in the first direction from the second well of the first transistor to the second well of the second transistor. The first direction, for example, is the x-direction. The portion of the device, as shown, includes a second well contact 168 that surrounds or circumscribes the gates 120 of the LD transistors of the ESD protection circuit. The second well contact, as described, serves as a substrate tap. The second well contact 168, in one embodiment, circumscribes the gate structures 120 of the respective first and second LD transistors. As shown, the second S/D or drain region 140 is displaced away and is in between the gates of the first and second LD transistors, while the first S/D or source regions 130 are disposed adjacent to the respective gates. The source region 130, in one embodiment, abuts the second well contact or the substrate tap 168.

The configuration of FIG. 2 as described above results in advantages. We have discovered that the configuration of having two gates or fingers 120 in one substrate tap 168 and having the substrate tap abutting the source region 130 as described in FIGS. 1 and 2 above dramatically enhances the holding voltage (Vh). For example, having two gates or fingers in one substrate tap ensures that each finger has the same snapback behavior. This results in improved and more uniform turn on of the ESD device. Furthermore, when the source region abuts the substrate tap, more voltage is required to maintain the snapback behavior due to the decrease in substrate resistance, which leads to an increase in Vh. Such configuration, for example, enables Vh to be higher than the operation voltage of circuit or device to be protected. Moreover, the device as described with respect to FIG. 1 and the configuration and layout of FIG. 2 above are advantageous since it enables Vh to be increased which leads to improved latch-up immunity while at the same time requiring less space, allowing more compact device to be produced and with enhanced ESD performance.

A plurality of ESD protection circuits may be interconnected by second well contacts to form an array 300*a*, as shown in FIG. 3*a*. The array includes a plurality of portions of the ESD protection circuit, as described in FIG. 2. Common elements may not be described or described in detail. The array includes n gates, n source regions, m drain regions and m substrate taps sharing a common substrate tap, interconnected in a first or x direction, forming an array. The array may also be interconnected in the first or x direction and a second or y direction having x rows and y columns of ESD protection circuits as shown in FIG. 3b.

Figure 4:
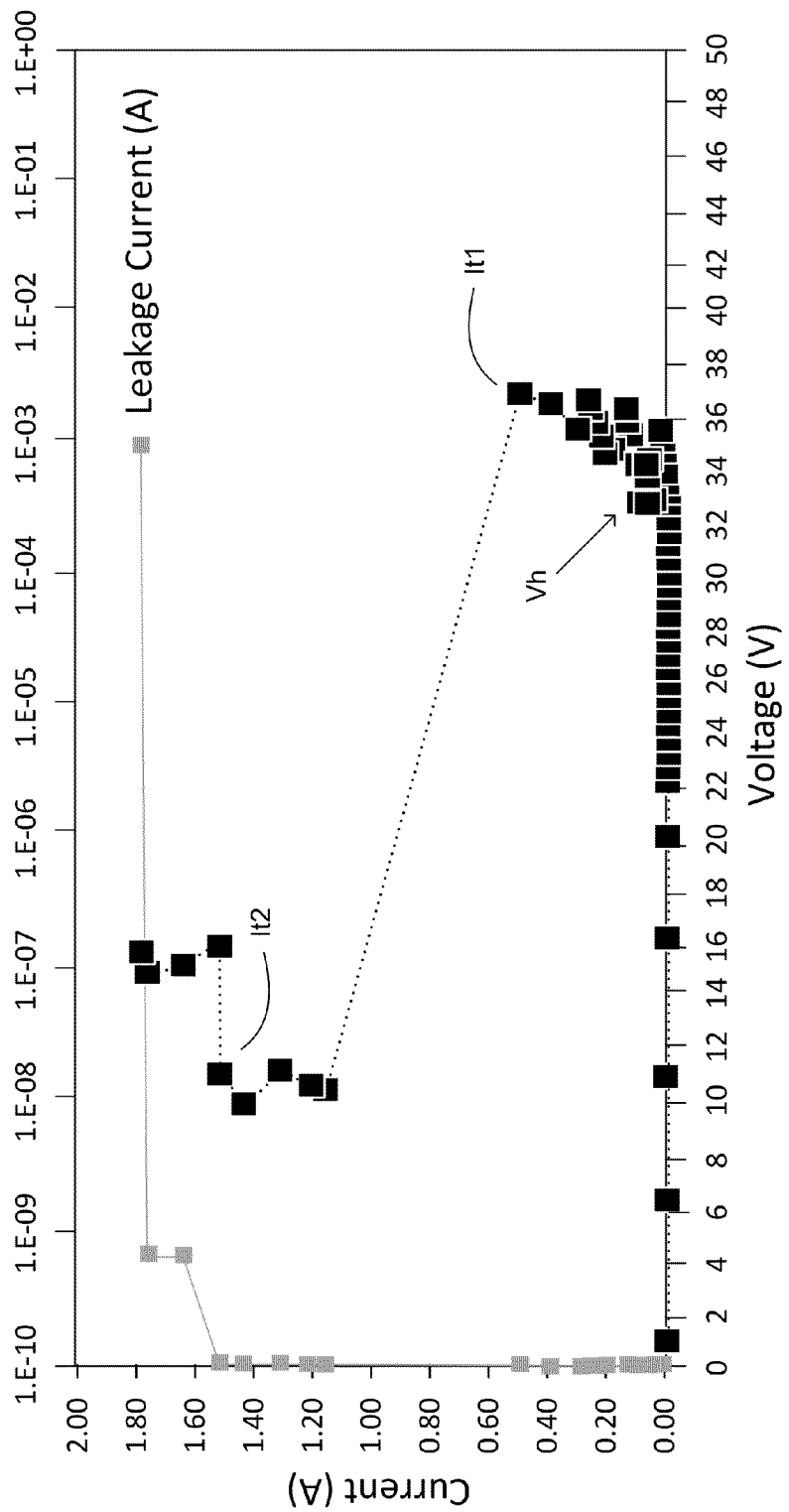
FIG. 4 shows a transmission line pulse (TLP) measurement of the device of FIG. 1.

FIG. 4 shows a TLP measurement of the embodiment of the ESD protection circuit as described with respect to FIG. 1. As shown in FIG. 4, the trigger or holding voltage (Vh) of the embodiment as described in FIG. 1 is about 33 V. As such, the embodiment as described above is suitable for use in, for example, devices produced under the 0.18 µm 30 V Bipolar CMOS DMOS (BCD) process. Other suitable type of processes may also be useful. The Vh, as shown, is higher than the operation voltage of the device. As a result, the latch up phenomena is eliminated. The trigger or holding current It1 of the embodiment, as shown, is larger than 400 mA, which is higher than 100 mA of general static latch up and 300 mA of general transient latch up specifications. The It2, which relates to the ESD performance, as shown, is about 1.5 A, which is about 2.2 kV for a given total width of, for example, 400 µm. As such, the ESD protection circuit as described above not only has improved ESD performance and enhanced latch up immunity, it is also suitable for use in standard HBM ESD performance specification, which is 2 kV with a total width of 400 µm.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A device comprising:
    a substrate defined with a device region, the device region comprises an ESD protection circuit having first and second transistors, wherein a transistor includes
        a gate having first and second sides,
        a first diffusion region in the device region adjacent to the first side of the gate, and
        a second diffusion region in the device region displaced away from the second side of the gate, wherein the second diffusion region is a common second diffusion region of the first and second transistors, wherein the first and second diffusion regions comprise first polarity type dopants;
    a first well disposed in the substrate and encompasses the device region, the first well comprises first polarity type dopants;
    second wells disposed within the first well, wherein the second wells encompass the first diffusion regions of first and second transistors and not the common second diffusion region, wherein the second wells comprise second polarity type dopants; and
    a third well disposed completely within the first well, the third well is disposed below and contiguous with the second diffusion region, wherein the third well comprises first polarity type dopants.

2. The device of claim 1 wherein the third well comprises a lower dopant concentration than the second diffusion region.

3. The device of claim 2 wherein the first polarity type comprises n type and the second polarity type comprises p type.

4. The device of claim 1 further comprising a well contact coupled to the second wells, wherein the well contact surrounds the gates of the transistors and abuts the first diffusion regions of the transistors.

5. The device of claim 1 comprising a drift isolation region disposed between the gate and the second diffusion region.

6. The device of claim 5 wherein the gate overlaps a portion of the drift isolation region.

7. The device of claim 5 wherein the drift isolation region is displaced away from the second diffusion region.

8. The device of claim 1 comprising a sidewall spacer disposed adjacent to the second side of the gate.

9. The device of claim 1 wherein the first diffusion region is a source region and the second diffusion is a drain region.

10. The device of claim 1 wherein the third well comprises a width which is the same as a width of the second diffusion region.

11. The device of claim 1 wherein the first and second diffusion regions, the first well and the third well comprise dopants of a first polarity type and the second wells comprise dopants of a second polarity type.

12. The device of claim 8 wherein the first polarity type comprises n type and the second polarity type comprises p type.

13. The device of claim 12 wherein the second well encompasses at least the well contact, first diffusion region and a part of the gate.

14. A device comprising:
    a substrate defined with a device region, the device region comprises an ESD protection circuit having first and second transistors, wherein a transistor includes
        a gate having first and second sides,
        a first diffusion region in the device region adjacent to the first side of the gate, and
        a second diffusion region in the device region displaced away from the second side of the gate, the second diffusion region is a common second diffusion region of the first and second transistors, wherein the first and second diffusion regions comprise dopants of a first polarity type;
    a first well encompasses the device region, wherein the first well comprises first polarity type dopants;
    second wells disposed within the first well, wherein the second wells encompass the first diffusion regions of the first and second transistors and not the common second diffusion region, the second wells comprise second polarity type dopants;
    a third well disposed completely within the first well, the third well is disposed below and contiguous with the second diffusion region, the third well comprises first polarity type dopants; and
    a well contact coupled to the second wells, wherein the well contact surrounds the gates of the transistors and abuts the first diffusion regions of the transistors.

15. The device of claim 14 wherein the third well comprises a lower dopant concentration than the second diffusion region.

16. The device of claim 15 wherein the first polarity type comprises n type and the second polarity type comprises p type.

17. The device of claim 14 wherein the second well encompasses at least the well contact, first diffusion region and a part of the gate.

18. The device of claim 4 wherein the second well encompasses at least the first diffusion region and a part of the gate.

19. The device of claim 14 further comprising a drift isolation region disposed within the first well, wherein the drift isolation region is between the gate and second diffusion region.

20. The device of claim 14 wherein the first diffusion region is a source region and the second diffusion is a drain region.

* * * * *